(12) United States Patent
David et al.

(10) Patent No.: US 8,691,662 B2
(45) Date of Patent: Apr. 8, 2014

(54) PROCESS FOR FABRICATING A SILICON-ON-INSULATOR STRUCTURE EMPLOYING TWO RAPID THERMAL ANNEALING PROCESSES, AND RELATED STRUCTURES

(71) Applicant: Soitec, Crolles Cedex (FR)

(72) Inventors: Carole David, Crolles (FR); Sébastien Kerdiles, Saint-Ismier (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/827,618

(22) Filed: Mar. 14, 2013

(65) Prior Publication Data

US 2013/0273712 A1   Oct. 17, 2013

(30) Foreign Application Priority Data

Apr. 11, 2012   (FR) ...................................... 12 53318

(51) Int. Cl.
  *H01L 21/46*   (2006.01)
(52) U.S. Cl.
  USPC ........................................................ 438/455
(58) Field of Classification Search
  USPC ........................................................ 438/455
  See application file for complete search history.

(56) References Cited

U.S. PATENT DOCUMENTS 7,863,158 B2   1/2011   Neyret et al.

FOREIGN PATENT DOCUMENTS

WO   2010049496 A1   5/2010

OTHER PUBLICATIONS

Aspar et al., "Silicon Wafer Bonding Technology for VLSI and MEMS applications", INSPEC, London, Chapter 3, pp. 35-52 (2002).
Mazara, W. P., "Silicon-on-insulator by wafer bonding: A review", Electrochem. Soc., vol. 138, No. 1, (1991).

*Primary Examiner* — Bradley K Smith
(74) *Attorney, Agent, or Firm* — TraskBritt

(57) ABSTRACT

A method for fabricating a silicon-on-insulator structure includes forming a first oxide layer on a silicon donor substrate, forming a second oxide layer on a supporting substrate, and forming a weakened zone in the donor substrate. The donor substrate is bonded to the supporting substrate by establishing direct contact between the first oxide layer on the silicon donor substrate and the second oxide layer on the supporting substrate and establishing a direct oxide-to-oxide bond therebetween. The donor substrate is split along the weakened zone to form a silicon-on-insulator structure, and the silicon-on-insulator structure is subjected to two successive rapid thermal annealing processes at temperatures T1 and T2, respectively, wherein T1 is less than or equal to T2, T1 is between 1200° C. and 1300° C., T2 is between 1240° C. and 1300° C., and when T1 is below 1240° C., then T2 is above 1240° C.

22 Claims, 3 Drawing Sheets

PROCESS FOR FABRICATING A SILICON-ON-INSULATOR STRUCTURE EMPLOYING TWO RAPID THERMAL ANNEALING PROCESSES, AND RELATED STRUCTURES

CROSS-REFERENCE TO RELATED APPLICATION

This application claims priority to French Patent Application Serial No. FR1253318, which was filed Apr. 11, 2012 in the name of David et al., and which is incorporated herein in its entirety by this reference.

TECHNICAL FIELD

Embodiments of the invention relate to the fabrication of silicon-on-insulator (SOI) substrates comprising a relatively thin buried oxide, namely a buried oxide that is typically between 5 and 50 nm in thickness and preferably between 10 and 20 nm in thickness.

BACKGROUND

Silicon-on-insulator (SOI) structures are frequently used in CMOS applications.

Such structures comprise, from their useful surface to their base, a thin silicon layer, a buried layer made of a dielectric material that is typically an oxide, for example, $SiO_2$, generally referred to by the acronym BOX (Buried OXide), and a supporting substrate.

To produce such substrates with relatively thin BOX layers, called UTBOX (Ultra-Thin Buried Oxide) SOIs, using the SMARTCUT® process (by way of reminder, this process is described in the article by B. Aspar and A. J. Auberton-Hervé "*Silicon Wafer Bonding Technology for VLSI and MEMS applications*" edited by S. S. Iyer and A. J. Auberton-Hervé, 2002, INSPEC, London, chapter 3, lines 35-52), which implements a step of direct bonding a donor substrate to a receiver substrate. There are two possible ways of implementing this bonding:

The first approach consists in bonding oxide to silicon (Ox/Si).

In this technique, the "future" buried oxide is carried by only one of the two bonded substrates, the other substrate being covered only with a thin native oxide layer that is about 1 nm in thickness.

This approach may be preferred when fabricating UTBOX substrates, the BOX of which is more than 15 nm in thickness, since it is a simple and inexpensive method. It is optionally supplemented with a plasma surface activation step in order to improve the macroscopic quality of the thin layer transferred and to ensure perfect "closure" of the bonding interface.

The second approach consists in bonding oxide to oxide (Ox/Ox).

In this technique, each of the two bonded wafers carries part of the future buried oxide. This approach may advantageously be implemented when producing UTBOX substrates, the BOX of which is less than 15 nm in thickness, since, under certain conditions, a better transfer quality can be obtained.

In each of the above two bonding configurations, particular care must be taken regarding the bonding interface, on the one hand so as to ensure a high-quality layer transfer using the SMARTCUT® process, and on the other hand to ensure the bonded structure has the electrical and mechanical properties required at the scale of the subsequently fabricated electronic components.

More precisely, and from the macroscopic point of view, the bonding interface must be characterized by the highest possible bonding energy. In the case of bonding with a view to transferring a thin layer using the SMARTCUT® process, this energy must be sufficiently high to guarantee layer transfer with minimal defects at the interface.

The bond is conventionally strengthened by supplying thermal energy, which helps form covalent bonds between the two bonded surfaces.

Bonding energy is a macroscopic property that may be measured using the razor blade method introduced by Maszara (as described in the article "*Silicon-on-insulator by wafer bonding: A review*" by W. P. Maszara, *J. Electrochem. Soc.*, Vol. 138, No. 1, 1991).

A high bonding energy is a necessary condition for producing UTBOX substrates ("mechanical" closure of the interface), but it does not guarantee that it will be possible to fabricate high-performance electronic components on these substrates.

From the microscopic point of view, the bonding interface must also be characterized by the fact that covalent bonds are formed uniformly over the entire bonding interface.

The bonding interface is then said to have been closed from the microscopic point of view, or indeed to have been stabilized. Thus, there must be no "remnant" of the bonding interface, such as micro- or nanocavities, synonymous with local variations in the electrical behavior of the bonding interface.

The distinction between these macroscopic and microscopic considerations at the bonding interface is described in U.S. Pat. No. 7,863,158.

An effective way of demonstrating the existence of any as yet imperfectly "stabilized" zones is to carry out chemical etching using a Wright Etch solution, which especially contains HF.

In the case of substrates comprising silicon layers and/or one or more thin buried oxide layers, employing Wright Etch solutions is problematic, and as such it is preferred to observe the cross section of the substrates using high-resolution transmission electron microscopy (abbreviated as "TEM").

The bonding interface is conventionally stabilized by annealing in an oven for 2 h at 1100° C., for an Ox/Si bond, and at 1200° C., for an Ox/Ox bond.

This type of treatment, in addition to being expensive and difficult to implement industrially, causes substantial local damage at the points where the wafer makes contact with the device used to support it in the oven (these defects being called "boat marks"). This long high-temperature treatment also creates regions of high stress, leading to the creation of defects such as slip lines.

For reasons of cost and quality, alternative approaches are being researched, in particular, approaches having lower thermal budgets.

In the case of oxide/silicon bonding, aforementioned U.S. Pat. No. 7,863,158 describes an approach that closes the interface perfectly.

It consists in either carrying out a plasma activation step before the bonding, supplemented with rapid thermal annealing (RTA) at 1200° C. for 30 s post-transfer, or two successive RTA treatments post-transfer, the first being carried out at 1200° C. for 30 s and the second between 1200° C. and 1250° C. for 30 s. This technique, which is appropriate for Ox/Si bonding, indeed makes the distinction between a strong bond (mechanical strength, at the macroscopic scale) and the microscopic aspect (structural stabilization of the bonding interface), the latter aspect being crucial if the components subsequently fabricated on the substrates thus produced are to function correctly.

In the case of oxide/oxide bonding, International Publication No. WO 2010/049496, in the name of the present Applicant, describes the advantage of implementing such bonding to produce UTBOX substrates using the SMARTCUT® technique, but only addresses the macroscopic aspect of the bonding.

In particular a process implementing Ox/Ox bonding is described therein, this process ensuring a high-quality transfer but not ensuring the substrate obtained has an optimal finish and not ensuring complete stabilization of the bonding interface.

Specifically, the conditions of the bonding and of the SMARTCUT® splitting anneal, and the strengthening of the bonding interface are all chosen in order to maximize the transfer quality of the thin layer, but do not allow the bonding interface to be closed from the microscopic point of view while limiting any damage during the finishing heat treatment.

Thus, this document teaches implementing an RTA at between 900° C. and 1300° C. in order to strengthen the bonding interface "macroscopically", i.e., in order to prevent defects from forming at the bonding interface.

The present inventors, following the teachings of International Publication No. WO 2010/049496 but implementing two successive RTAs, as taught by U.S. Pat. No. 7,863,158, have observed that these anneals do not stabilize the Ox/Ox bonding interface, and therefore the substrates realized in this way do not provide the electrical performance required for microelectronic or optoelectronic applications.

For example, after a finishing step comprising two RTAs at 1200° C. for 30 s, the Ox/Ox bonding interface 22 is still very partially open, as appended FIGS. 2A and 2B show, these figures being TEM micrographs of an interface 22.

Thus, for FIG. 2A, two RTAs were carried out, at the same temperature (1200° C.) and for a length of time of 30 s. For FIG. 2B, the first RTA was carried out at 1200° C. for 30 s, and the second at 1250° C. for the same length of time.

The presence of a large number of nanocavities will be noted, meaning that the formation of covalent bonds between the two bonded surfaces is still incomplete. If a transistor were fabricated above these defective zones, it would perform differently to those produced above stabilized zones, or it might not function at all.

BRIEF SUMMARY

The aim of the invention is therefore to solve these problems by providing a process for fabricating SOI substrates comprising a relatively thin buried oxide, namely a buried oxide typically between 5 and 50 nm in thickness and preferably between 10 and 20 nm in thickness, in which the oxide/oxide bonding interface is stabilized while damage, such as slip lines and pin marks, is minimized and surface roughness is reduced.

Thus, the present invention relates to a process for fabricating a silicon-on-insulator structure, comprising a silicon layer, a buried oxide layer that is 50 nm or less in thickness, and a supporting substrate, which comprises:
  a) forming a first oxide layer on a silicon donor substrate;
  b) forming a second oxide layer on said supporting substrate;
  c) forming a weakened zone in the donor substrate;
  d) bonding the two substrates, the two oxide layers being brought into contact and forming together said buried oxide layer; and
  e) splitting the donor substrate along the weakened zone, characterized in that the silicon-on-insulator structure thus obtained after step e) is subjected to two successive RTAs respectively having temperatures T1 and T2, and cumulatively meeting the following conditions:
    i) T1 is less than or equal to T2;
    ii) T1 is between 1200° C. and 1300° C.;
    iii) T2 is between 1240° C. and 1300° C.; and
    iv) when T1 is below 1240° C., then T2 is above 1240° C.

This process stems from the observation that more damage is caused by the RTAs if the first RTA is more "aggressive" than the second.

According to other non-limiting but advantageous features of the invention:
  the length of each of the RTAs is between 30 and 120 s;
  the first RTA is carried out at 1200° C. for 30 to 120 s, whereas the second RTA is carried out between 1275° C. and 1300° C. for 30 to 120 s;
  the first and second RTAs are carried out at a temperature between 1240° C. and 1275° C. for 30 to 120 s;
  there is no need to carry out a plasma activation of said oxide layers; and
  between the two RTAs a stabilization step is implemented, said step being a long anneal.

BRIEF DESCRIPTION OF THE DRAWINGS

Other features and advantages of the invention will become apparent on reading the following description of a preferred embodiment of the invention. This description is given with reference to the appended drawings in which.

DETAILED DESCRIPTION

Figure 1A:
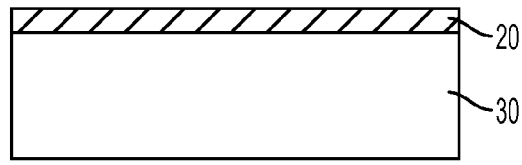
FIGS. 1A through 1E are schematic illustrations of various steps in a process according to the invention.

In a first step of the invention, a thin oxide layer 20 is formed on the surface of what is called a "donor" substrate 30. This step is shown in FIG. 1A. The substrate 30 is made of silicon and the oxide layer 20 may, for example, be formed by thermal oxidation of the donor substrate 30, or optionally by oxide deposition.

Figure 1B:
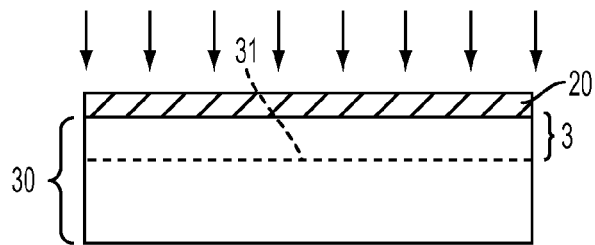

Before or after the oxide layer 20 has been formed, dopant elements are introduced into the donor substrate 30 so as to form a weakened zone 31, as shown in FIG. 1B. This step is preferably carried out by implanting atomic or ionic elements, such as, for example, by co-implanting helium and hydrogen, for example, through the oxide layer 20.

This weakened layer 31 is advantageously introduced with a view to thinning the substrate 30 by splitting. To do this, the well-known splitting process described above, namely the SMARTCUT® process, will preferably be used.

Figure 1C:
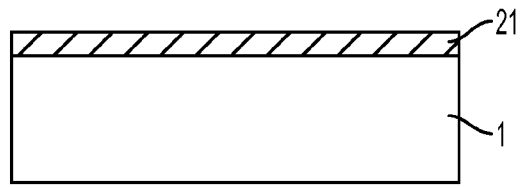

Next, or in parallel, what is called a "bonding" oxide layer 21 is formed on a second substrate, this substrate being called the "final" or "receiver" substrate 1, as shown in FIG. 1C. The substrate 1 is either thermally oxidized or, optionally, the oxide is deposited.

In any case, provision is made for the combined thickness of the layers 20 and 21 not to exceed 50 nm.

Figure 1D:
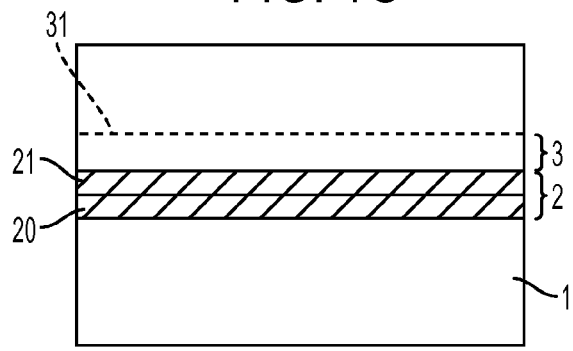
Figure 1E:
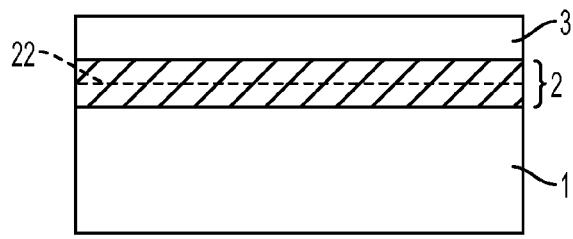
Figures 2A, 2B:
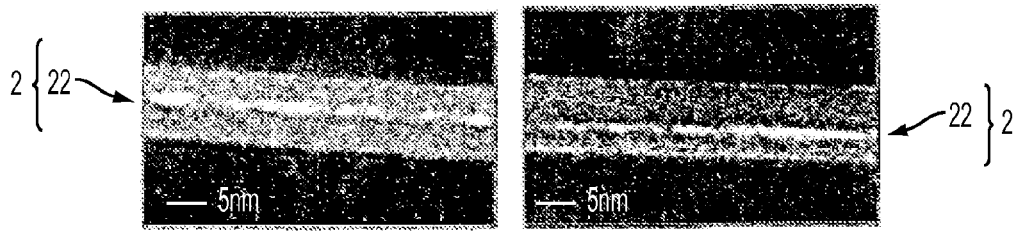
FIGS. 2A and 2B are, as seen above in the introduction of the present description, TEM micrographs of an interface obtained by implementing a prior-art technique.

In the following step, which is shown in FIG. 1D, the two oxide layers 20, 21 are bonded to one another so as to than a buried oxide layer 2.

After this bonding step, a strengthening heat treatment is carried out, which initiates the splitting of the donor substrate 30 in the weakened zone 31. This configuration is shown in FIG. 1D. At this stage, the interface 22 between the two oxide layers 20 and 21 can still be seen.

Figure 3A:
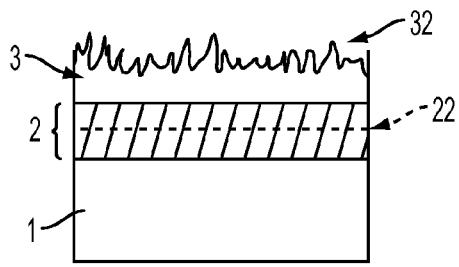
FIGS. 3A through 3C are schematic views of a structure according to the invention during the implementation of two RTAs.

Moreover, because of the separation that takes place in the donor substrate 30, the upper surface of the silicon layer 3 thus obtained, this layer being denoted by the reference number 32 in FIG. 3A, is particularly rough.

This is the reason why, according to embodiments of the present disclosure, two successive rapid thermal annealing (RTA) processes are carried out. The RTA processes have the features mentioned above, namely that:

i) the temperature T1 of the first RTA process is less than or equal to the temperature T2 of the second RTA;
ii) the temperature T1 of the first RTA process is between 1200° C. and 1300° C.;
iii) the temperature T2 of the second RTA process is between 1240° C. and 1300° C.; and
iv) when the temperature T1 of the first RTA process is below 1240° C., then the temperature T2 of the second RTA process is above 1240° C.

Figure 3B:
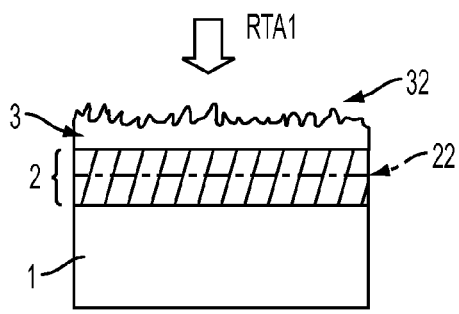
Figure 3C:
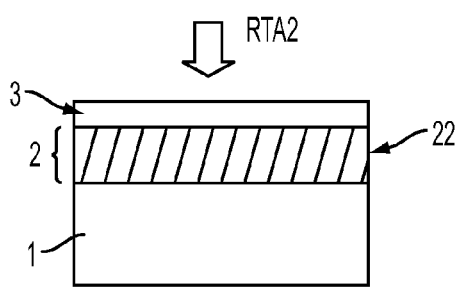

FIG. 3B is a simplified illustration of how the structure of FIG. 3A may appear after performing the first RTA process, and FIG. 3C is a simplified illustration of how the structure may appear after performing the second RTA process. When the operating conditions for the first and second RTA processes as described herein are followed, a structure such as that illustrated in FIG. 3C may be obtained, in which the interface between the two oxide layers 20, 21 (FIG. 1D) cannot be seen and the exposed upper surface of the upper silicon layer 3 is completely smooth.

Figures 4A, 4B, 4C:
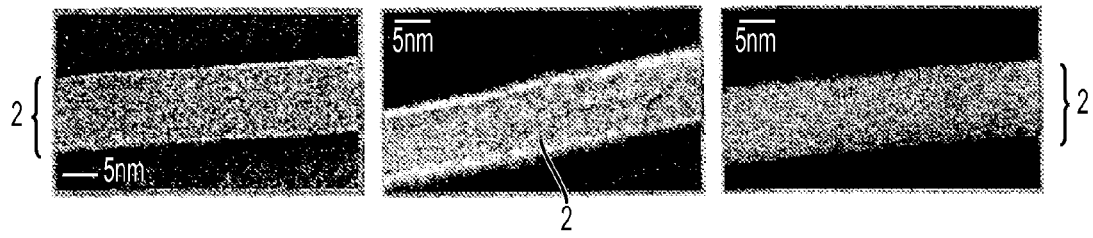
FIGS. 4A through 4C are TEM micrographs of three SOI structures obtained according to the invention, these micrographs more particularly being focused on the oxide/oxide interface.

With regard to FIG. 4A, an at least substantially completely closed interface is obtained by implementing a first RTA at 1200° C. for 30 s and a second RTA at 1300° C. for 30 s.

In the case of FIG. 4B, an at least substantially perfect closure of the interface is also observed when both RTAs are carried out at 1240° C. for 30 s.

Finally, the interface is also closed in FIG. 4C when the first RTA is carried out at 1200° C. for 90 s and the second RTA is carried out at 1275° C. for 30 s.

Figure 5:
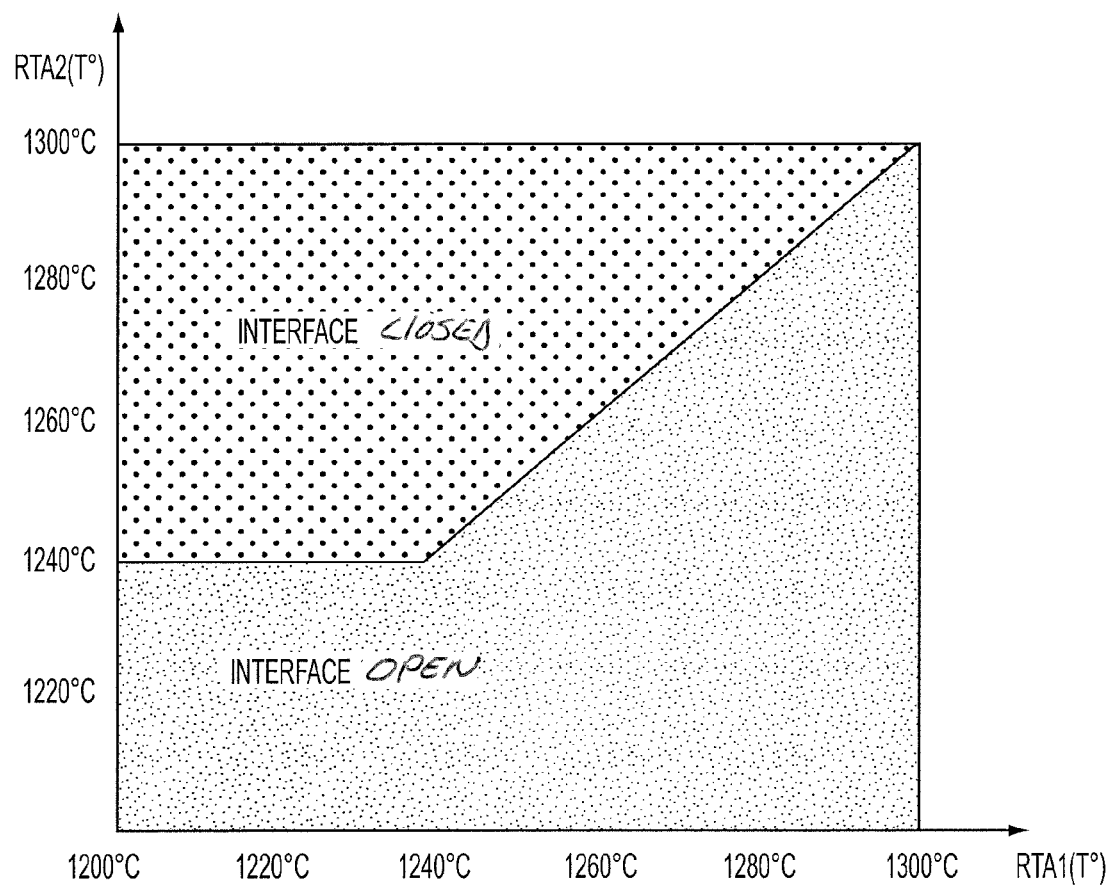
FIG. 5 is a graph representing temperature ranges of first and second RTA for which a closed interface is obtained according to the invention.

Generally, the Applicants have been able to demonstrate that the first RTA process must be less "violent" than the second RTA process, and, thus, have been able to define a temperature range, which is shown in FIG. 5, in which range a closed interface is obtained, which is the desired result.

In summary, the invention consists in macroscopically and microscopically closing an oxide/oxide directly bonded interface without degrading the quality of the superficial silicon layer, by carrying out not one single high-temperature RTA treatment, but two RTAs in succession.

The first of these anneals is carried out at the lowest possible temperature, in order to limit the creation of defects, and the second is sufficiently aggressive for the cumulative thermal budget of the two RTAs to be sufficient to perfectly close the bonding interface.

This two-step treatment, in addition to enabling complete closure of the bonding interface with minimum damage to the surface of the wafers, also reduces surface roughness. In other words, this process smooths the surface layer.

Finally, and advantageously, there is no need, in the present process, to implement a plasma activation step. Moreover, a stabilization step may be carried out, i.e., a long anneal between the two RTAs.

Additional non-limiting example embodiments of the disclosure are set forth below.

Embodiment 1

A method for fabricating a silicon-on-insulator structure, comprising: forming a first oxide layer on a silicon donor substrate; farming a second oxide layer on a supporting substrate; forming a weakened zone in the donor substrate; bonding the donor substrate to the supporting substrate by establishing direct contact between the first oxide layer on the silicon donor substrate and the second oxide layer on the supporting substrate and establishing a direct oxide-to-oxide bond therebetween, the bonded first oxide layer and second oxide layer together forming a buried oxide layer of the silicon-on-insulator structure having a thickness of about 50 nm or less; splitting the donor substrate along the weakened zone to form a silicon-on-insulator structure; and after splitting the donor substrate along the weakened zone; subjecting the silicon-on-insulator structure to two successive rapid thermal annealing processes including a first rapid thermal annealing process performed at a first temperature T1 and a second rapid thermal annealing process performed at a second temperature T2, wherein: i) T1 is less than or equal to T2; ii) T1 is between 1200° C. and 1300° C.; iii) T2 is between 1240° C. and 1300° C.; and iv) when T1 is below 1240° C., then T2 is above 1240° C.

Embodiment 2

The method of Embodiment 1, wherein T1 is between 1200° C. and 1240° C. and T2 is between 1275° C. and 1300° C.

Embodiment 3

The method of Embodiment 1, wherein T1 is between 1200° C. and 1240° C. and T2 is between 1240° C. and 1275° C.

Embodiment 4

The method of Embodiment 2 or Embodiment 3, wherein T1 is 1200° C.

Embodiment 5

The method of Embodiment 1, wherein T1 and T2 are each between 1240° C. and 1275° C.

Embodiment 6

The method of any one of Embodiments 1 through 5, wherein a duration of the first rapid thermal annealing process is between 30 seconds and 120 seconds.

Embodiment 7

The method of any one of Embodiments 1 through 6, wherein a duration of the second rapid thermal annealing process is between 30 seconds and 120 seconds.

Embodiment 8

The method of any one of Embodiments 1 through 7, wherein neither the first oxide layer nor the second oxide layer is subjected to a plasma activation process prior to bonding the donor substrate to the supporting substrate.

Embodiment 9

The method of any one of Embodiments 1 through 8, further comprising subjecting the silicon-on-insulator structure to a stabilization annealing process after the first rapid thermal annealing process and prior to the second rapid thermal annealing process.

Embodiment 10

A method for fabricating a semiconductor structure, comprising: directly bonding a first oxide layer of a donor substrate to a second oxide layer of a supporting substrate; splitting the donor substrate along a weakened zone therein to form a semiconductor structure including a layer of semiconductor material from the donor substrate on the supporting substrate with a buried oxide layer therebetween defined by the bonded first oxide layer and second oxide layer; subjecting the semiconductor structure to a first rapid thermal annealing process at a first temperature T1; and after the first rapid thermal annealing process, subjecting the semiconductor structure to a second rapid thermal annealing process at a second temperature T2, wherein T1 is less than or equal to T2, T1 is between 1200° C. and 1300° C., T2 is between 1240° C. and 1300° C., and if T1 is below 1240° C., then T2 is above 1240° C.

Embodiment 11

The method of Embodiment 10, wherein T1 is between 1200° C. and 1240° C. and T2 is between 1275° C. and 1300° C.

Embodiment 12

The method of Embodiment 10, wherein T1 is between 1200° C. and 1240° C. and T2 is between 1240° C. and 1275° C.

Embodiment 13

The method of Embodiment 11 or Embodiment 12, wherein T1 is 1200° C.

Embodiment 14

The method of Embodiment 10, wherein T1 and T2 are each between 1240° C. and 1275° C.

Embodiment 15

The method of any one of Embodiments 10 through 14, wherein a duration of the first rapid thermal annealing process is between 30 seconds and 120 seconds.

Embodiment 16

The method of any one of Embodiments 10 through 15, wherein a duration of the second rapid thermal annealing process is between 30 seconds and 120 seconds.

Embodiment 17

The method of any one of Embodiments 10 through 16, wherein neither the first oxide layer nor the second oxide layer is subjected to a plasma activation process prior to directly bonding the first oxide layer of the donor substrate to the second oxide layer of the supporting substrate.

Embodiment 18

The method of any one of Embodiments 1 through 8, further comprising subjecting the silicon-on-insulator structure to a stabilization annealing process after the first rapid thermal annealing process and prior to the second rapid thermal annealing process.

While embodiments of the present invention have been described herein using certain examples, those of ordinary skill in the art will recognize and appreciate that the invention is not limited to the particulars of the example embodiments. Rather, many additions, deletions and modifications to the example embodiments may be made without departing from the scope of the invention as hereinafter claimed. For example, features from one embodiment may be combined with features of other embodiments while still being encompassed within the scope of the invention as contemplated by the inventors.

What is claimed is:

1. A method for fabricating a silicon-on-insulator structure, comprising:
   forming a first oxide layer on a silicon donor substrate;
   forming a second oxide layer on a supporting substrate;
   forming a weakened zone in the donor substrate;
   bonding the donor substrate to the supporting substrate by establishing direct contact between the first oxide layer on the silicon donor substrate and the second oxide layer on the supporting substrate and establishing a direct oxide-to-oxide bond therebetween, the bonded first oxide layer and second oxide layer together forming a buried oxide layer of the silicon-on-insulator structure having a thickness of about 50 nm or less;
   splitting the donor substrate along the weakened zone to form a silicon-on-insulator structure; and
   after splitting the donor substrate along the weakened zone; subjecting the silicon-on-insulator structure to two successive rapid thermal annealing processes including a first rapid thermal annealing process performed at a first temperature T1 and a second rapid thermal annealing process performed at a second temperature T2, wherein:
   i) T1 is less than or equal to T2;
   ii) T1 is between 1200° C. and 1300° C.;
   iii) T2 is between 1240° C. and 1300° C.; and
   iv) when T1 is below 1240° C., then T2 is above 1240° C.

2. The method of claim 1, wherein a duration of the first rapid thermal annealing process is between 30 seconds and 120 seconds.

3. The method of claim 2, wherein a duration of the second rapid thermal annealing process is between 30 seconds and 120 seconds.

4. The method of claim 3, wherein T1 is between 1200° C. and 1240° C. and T2 is between 1275° C. and 1300° C.

5. The method of claim 4, wherein T1 is 1200° C.

6. The method of claim 3, wherein T1 and T2 are each between 1240° C. and 1275° C.

7. The method of claim 3, wherein T1 is between 1200° C. and 1240° C. and T2 is between 1240° C. and 1275° C.

8. The method of claim 3, wherein neither the first oxide layer nor the second oxide layer is subjected to a plasma activation process prior to bonding the donor substrate to the supporting substrate.

9. The method of claim 3, further comprising subjecting the silicon-on-insulator structure to a stabilization annealing process after the first rapid thermal annealing process and prior to the second rapid thermal annealing process.

10. The method of claim 1, wherein T1 is between 1200° C. and 1240° C. and T2 is between 1275° C. and 1300° C.

11. The method of claim 10, wherein T1 is 1200° C.

12. The method of claim 1, wherein T1 and T2 are each between 1240° C. and 1275° C.

13. The method of claim 1, wherein T1 is between 1200° C. and 1240° C. and T2 is between 1240° C. and 1275° C.

14. The method of claim 1, wherein neither the first oxide layer nor the second oxide layer is subjected to a plasma activation process prior to bonding the donor substrate to the supporting substrate.

15. The method of claim 1, further comprising subjecting the silicon-on-insulator structure to a stabilization annealing process after the first rapid thermal annealing process and prior to the second rapid thermal annealing process.

16. A method for fabricating a semiconductor structure, comprising:

directly bonding a first oxide layer of a donor substrate to a second oxide layer of a supporting substrate;

splitting the donor substrate along a weakened zone therein to form a semiconductor structure including a layer of semiconductor material from the donor substrate on the supporting substrate with a buried oxide layer therebetween defined by the bonded first oxide layer and second oxide layer;

subjecting the semiconductor structure to a first rapid thermal annealing process at a first temperature T1; and after the first rapid thermal annealing process, subjecting the semiconductor structure to a second rapid thermal annealing process at a second temperature T2, wherein T1 is less than or equal to T2, T1 is between 1200° C. and 1300° C., T2 is between 1240° C. and 1300° C., and if T1 is below 1240° C., then T2 is above 1240° C.

17. The method of claim 16, wherein a duration of the first rapid thermal annealing process is between 30 seconds and 120 seconds.

18. The method of claim 17, wherein a duration of the second rapid thermal annealing process is between 30 seconds and 120 seconds.

19. The method of claim 16, wherein T1 is between 1200° C. and 1240° C. and T2 is between 1275° C. and 1300° C.

20. The method of claim 19, wherein T1 is 1200° C.

21. The method of claim 16, wherein T1 and T2 are each between 1240° C. and 1275° C.

22. The method of claim 16, wherein T1 is between 1200° C. and 1240° C. and T2 is between 1240° C. and 1275° C.

* * * * *